United States Patent
Sharma et al.

(10) Patent No.: US 7,284,389 B2
(45) Date of Patent: Oct. 23, 2007

(54) TWO-FLUID SPRAY COOLING SYSTEM

(75) Inventors: Ratnesh Sharma, Union City, CA (US); Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 325 days.

(21) Appl. No.: 11/040,403

(22) Filed: Jan. 21, 2005

(65) Prior Publication Data
US 2006/0162363 A1 Jul. 27, 2006

(51) Int. Cl.
*F25D 3/00* (2006.01)
(52) U.S. Cl. .................... 62/310; 62/259.2
(58) Field of Classification Search ............ 62/121, 62/171, 259.2, 310; 165/104.21; 361/699
See application file for complete search history.

(56) References Cited

U.S. PATENT DOCUMENTS

| | | | | |
|---|---|---|---|---|
| 5,907,473 A | * | 5/1999 | Przilas et al. ............ | 361/699 |
| 5,925,291 A | * | 7/1999 | Bharathan et al. ....... | 261/69.1 |
| 5,943,211 A | * | 8/1999 | Havey et al. ............ | 361/699 |
| 6,205,799 B1 | | 3/2001 | Patel et al. | |
| 6,293,121 B1 | * | 9/2001 | Labrador ................. | 62/304 |
| 6,349,554 B2 | | 2/2002 | Patel et al. | |
| 6,457,321 B1 | | 10/2002 | Patel et al. | |
| 6,484,521 B2 | | 11/2002 | Patel et al. | |
| 6,550,263 B2 | | 4/2003 | Patel et al. | |
| 6,595,014 B2 | | 7/2003 | Malone et al. | |
| 6,604,370 B2 | | 8/2003 | Bash et al. | |
| 6,612,120 B2 | | 9/2003 | Patel et al. | |
| 6,644,058 B2 | | 11/2003 | Bash et al. | |
| 6,646,879 B2 | * | 11/2003 | Pautsch ................... | 361/699 |
| 6,708,515 B2 | | 3/2004 | Malone et al. | |
| 6,817,196 B2 | | 11/2004 | Malone et al. | |
| 6,817,204 B2 | | 11/2004 | Bash et al. | |

* cited by examiner

*Primary Examiner*—Melvin Jones

(57) ABSTRACT

A cooling system including a housing forming a cooling chamber containing the component submerged in a pool of alcohol, oil or glycerine, a sprayer configured to spray water at the component through the oil or glycerine, and a heat exchanger configured to cool the oil or glycerine. A control system receives heat-generation information from temperature sensors on water-impingement regions of the component, and controls the spraying in response to this information. A pump pumps the oil or glycerine from a lower portion of the cooling chamber to the heat exchanger. A sprayer inlet draws water from an upper portion of the cooling chamber, or from a lower portion of a reservoir connected to the heat exchanger. Oil or glycerine is passed from a portion of the heat exchanger reservoir back to the cooling chamber, and water passes from an upper portion of the reservoir to the sprayer. Alternatively, the oil or glycerine could be replaced with helium.

28 Claims, 4 Drawing Sheets

TWO-FLUID SPRAY COOLING SYSTEM

The present invention relates generally to cooling systems for heat-generating components and, more particularly, to a spray cooling system wherein a first fluid is sprayed through a second fluid, and methods of using the spray cooling system to cool one or more semiconductor devices (i.e., chips).

BACKGROUND OF THE INVENTION

With the advent of semiconductor devices having increasingly large component densities, the removal of heat generated by the devices has become an increasingly challenging technical issue. Over time, the frequency of operation of CMOS devices has increased significantly. The resulting microprocessor power dissipation has likewise gone up by an order of magnitude. While the input voltage and capacitance of devices have decreased, the number of devices on a typical microprocessor die continues to increase rapidly as processing efficiency is sought. Moreover, device miniaturization has led device designers to integrate previously separate components, such as those used to create a cache, into the microprocessor die.

This consolidation of devices has resulted in high CPU core power density, e.g., 50% of a 20 mm by 20 mm microprocessor die may contain the CPU core, with the rest being cache. Furthermore, typical processor boards can, in some instances, include multiple CPU modules, application-specific integrated circuits (ICs), and static random access memory (SRAM), as well as a dc-dc converter, all of which have increasing power dissipation requirements, thereby increasing the total power dissipation level needed by computer systems.

Air-cooled heat sinks can be used to increase the heat-dissipating surface area of heat-producing devices. High-conductivity gases have been used within such heat sinks to increase the efficiency of the heat transfer within the divice. However, heat sinks are typically characterized by a mechanical interface to their cooled devices, which commonly leads to interference in the heat flow, and can lead to very high thermal resistance. Indeed, the bulk of the available thermal budget for cooling, typically a 45 degrees C. temperature differential between the chip temperature and the ambient temperature, will commonly be used up by this interface. The mechanical interface can also lead to uneven cooling. This is further complicated by the non-uniform power distribution on many chips, which often results when different components are integrated onto a single chip.

To deal with these difficulties, innovative ways have been developed to reduce chip-to-heat sink thermal resistance. Included among the cooling methods for semiconductors are free-flowing and forced-air convection, free-flowing and forced-liquid convection, pool boiling (i.e., boiling a liquid cooling fluid off a submerged device), and spray cooling (i.e., boiling a liquid cooling fluid off a device being sprayed with the liquid). Because liquids typically have a high latent heat of vaporization, these latter two methods provide for a high heat-transfer efficiency, absorbing a large quantity of heat at a constant temperature.

The use of these boiling/vaporizing methods is limited to a maximum power density, the critical heat flux (CHF). At higher densities, the vaporized cooling fluid forms a vapor barrier insulating the device from the liquid cooling fluid, thus allowing the wall temperature of the device to increase greatly. This phenomenon is referred to as dry-out. When a coolant is properly sprayed, it can disperse such a vapor layer, and its CHF can be well over an order of magnitude higher than the CHF of a pool-boiling system. This high CHF is preferably a uniform spray, and should match the power dissipation requirements of the device. Thus, spray cooling presently provides the most efficient cooling for a heat-generating device, such as a semiconductor device.

In a typical spray cooling system, a cooling fluid is sprayed through an evacuated chamber at the component. Typically, the cooling fluid used for spray cooling has a relatively low boiling point (in relation to the operating temperature of the device), which is the temperature that the sprayed device is cooled toward. Most preferably, the cooling fluid is inert to the heat source. For semiconductor devices, low boiling point fluids such as 3M® FC-72, (FC-72, i.e., FLUORINERT®, sold by 3M® Corporation), 3M's Novec line of fluids (HFE 7100, etc., sold by 3M® Corporation) or PF-5060 are among a number of known suitable cooling liquids. Water may also be preferable in some instances.

A number of factors affect the performance of spray cooling, thus affecting the heat transfer coefficient h and/or the CHF. It is commonly understood that surface roughness and wettability of the sprayed component are two of these factors, and the orientation of the surface being sprayed can be a third. In particular, it is believed that h is higher for rough surfaces when using a pressurized liquid spray, and for smooth surfaces when using gas atomizing. Surfaces with decreased wettability appear to have a marginal increase in h.

Critical to consistent, controlled cooling is the controlled application of the liquid cooling fluid in a desired distribution, flow rate, and velocity. For example, at a low mass flow rate, CHF and h increase with the mass flow rate. However, at a critical mass flow rate, the advantages of increased mass flow are diminished due to pooling and/or due to a transition to single phase heat transfer. Thus, a spray cooling system is preferably operated uniformly at a mass flow rate defined at a point before the critical mass flow rate is reached. All of these factors make critical the design of the sprayer, i.e., the design of the nozzle and its related spray devices.

Also important is the interaction between sprayed cooling fluid and the surface of the component. Splashing of the cooling fluid can cause significant deterioration of the heat transfer performance. This can result in hot spots being formed at low power density regions adjacent to the regions covered by the spray. Additionally, not all portions of a component are spray cooled, thus allowing for hot spots in lower heat flux areas, and in large thermal gradients.

Also important to the cooling system design is its operating temperature. In particular, it is desirable to configure the system to operate at a high h, which will occur with a design temperature above the boiling temperature and below a temperature that will dry out the sprayed coolant. The amount of heat to be dissipated must be less than the CHF.

Accordingly, there has existed a need for a small, accurate, reliable and cost-efficient spray cooling system that can be used to support complex processing systems having one or more high-dissipation devices. The spray cooling system will preferably offer efficient power usage and an effective life span from the standpoint of a computer system operator. Preferred embodiments of the present invention satisfy these and other needs, and provide further related advantages.

SUMMARY OF THE INVENTION

In various preferred embodiments, the present invention solves some or all of the needs mentioned above by providing a package-level cooling system that efficiently operates to provide accurate cooling to a component over a significant life span.

The cooling system for cooling a component such as a semiconductor device, of the invention, features a housing, a sprayer and a heat exchanger. The housing forms a cooling chamber in which the component is thermally exposed, and the chamber contains a body (i.e., a volume) of a first cooling fluid. The sprayer is configured to spray a second cooling fluid, in a liquid state, through the body of the first cooling fluid and into thermal contact with an impingement region of the thermally exposed component. The heat exchanger configured to cool the body of the first cooling fluid. The second cooling fluid is of a different composition than the first cooling fluid. In some preferred embodiments, these features provide for a reduction of the splashing that could be caused by spray cooling, and a reduction of the temperature gradients that may occur with a cooling system that only cools a portion of the component.

The invention may further feature a control system configured to receive heat-generation information for the impingement region of the component. Using the heat-generation information, the controller is configured to control the spraying of the sprayer and/or the cooling of the first cooling fluid. In some preferred embodiments these features provide for energy efficient and precise cooling of a component based on its cooling needs.

The invention may also feature that one of the first and second cooling fluids is a more-dense liquid, and the other of the first and second cooling fluids is a less-dense liquid. When mixed, the cooling fluids separate such that the less-dense liquid floats on the more-dense liquid.

Other features and advantages of the invention will become apparent from the following detailed description of the preferred embodiments, taken in conjunction with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read in conjunction with the accompanying drawings. This detailed description of particular preferred embodiments of the invention, set out below to enable one to build and use particular implementations of the invention, is not intended to limit the enumerated claims, but rather it is intended to provide particular examples thereof.

Spray cooling promises to be a technology that can deliver high performance cooling. An objective of spray cooling is for a device's wall-temperature to achieve a value close to a coolant's saturation temperature.

Figure 1:
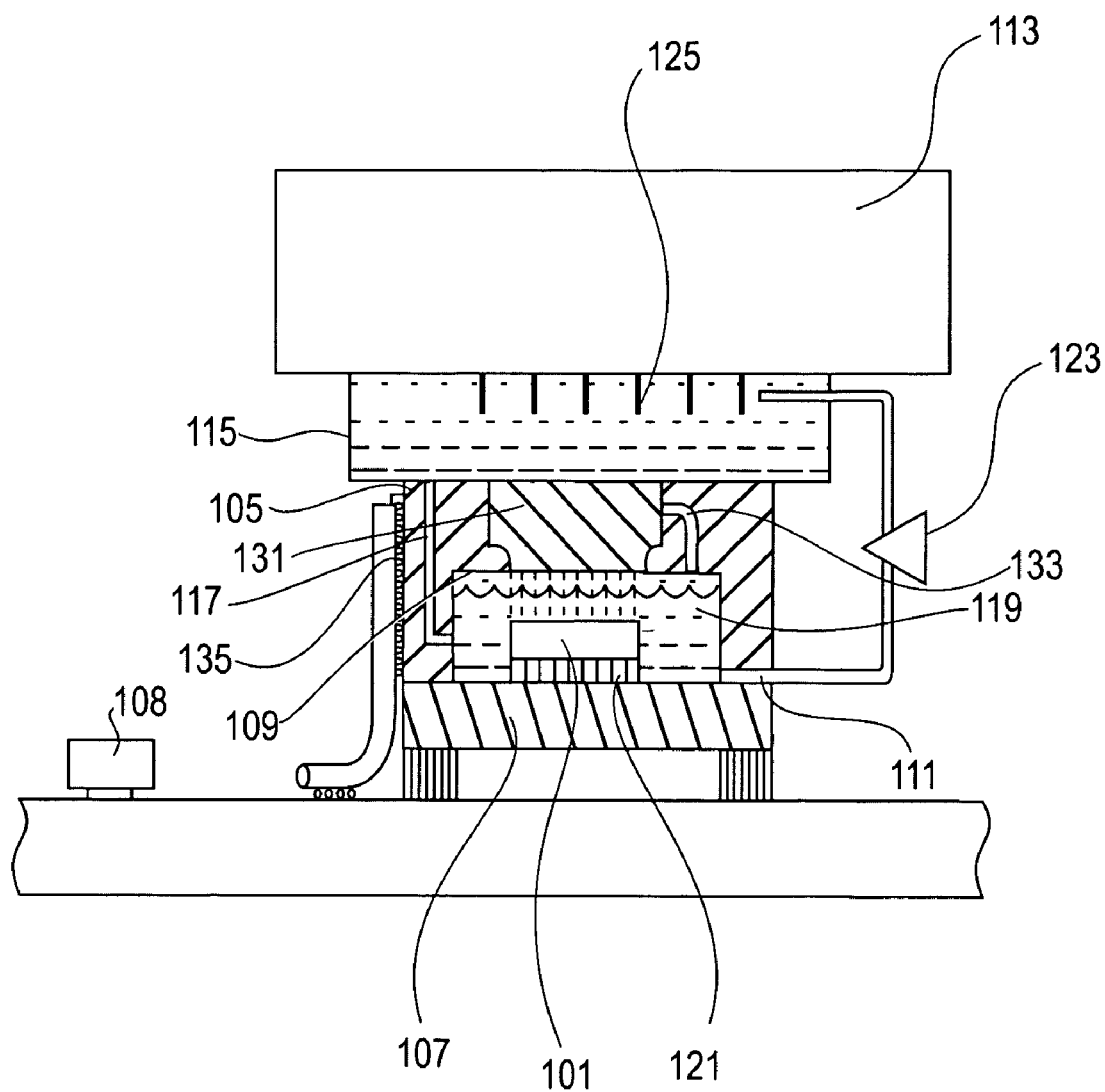
FIG. 1 is a cross-sectional view of a first cooling system embodying the invention.

With reference to FIG. 1, a first embodiment of a cooling system is for cooling a component 101, such as a heat-generating semiconductor device, other information processing device, optical component, or the like. The cooling system cools the component with two cooling fluids of different compositions, a first cooling fluid, and a second cooling fluid. The two cooling fluids are immiscible. One of the two cooling fluids has a density greater than the other, and thus when the two are mixed in their liquid state, one of the two cooling fluids floats and the other sinks to a separated state. Exemplary first and second cooling fluids include oil and water, respectively, or alcohol and water, respectively.

The cooling system is incorporated into a housing forming a cooling cap 105, which is affixed to a substrate 107 mounting the component 101. The cooling cap may be removably affixed to the substrate, providing for both the cooling cap to be a modular part, and the component to be serviceable. The cooling system forms a closed loop system in the cooling cap when the cooling cap is affixed to the substrate. The cooling system includes a first cooling loop configured to convectively cool the component, a second cooling loop configured to spray cool the component, and a controller 108.

Because the two cooling loops operate simultaneously, but at different rates of heat flux, different regions of the component are cooled at different rates depending on their cooling needs, providing for a reduction in overall temperature gradients across the component. The controller may be in a separate piece of hardware (as depicted), or incorporated within the component. The controller may be mechanical, electrical, software, or in another such control system form.

The first cooling subsystem preferably operates as a convective liquid loop cooling system. To this end, the cooling cap forms a cavity defining a cooling chamber 109, when affixed to the substrate 107, a cooling fluid exhaust passageway 111, a heat exchanger 113, a reservoir 115 and a cooling fluid return passageway 117. The component 101 is thermally exposed in, and preferably contained within, the cooling chamber 109, into which the first cooling fluid pours from the cooling fluid return passageway 117.

A body of the first cooling fluid within the cooling chamber 109, received from the heat exchanger in a liquid state, forms a cooling pool 119 around the component 101, and preferably completely wets the component. The first cooling fluid cools all thermally exposed portions of the component to which it is exposed via natural convection. This process is aided by the first cooling fluid's flow through the cooling chamber, and by fluid movement caused by interaction with spray cooling using the second cooling fluid, as is discussed below. In short, the first cooling fluid, while flowing through the cooling chamber, absorbs component heat and convectively removes the heat from the component.

Preferably, the first cooling fluid is characterized by a boiling point higher than a maximum temperature at which the cooling system is configured to have the first cooling fluid reach during normal cooling system operation. More particularly, the first cooling fluid is characterized by a boiling point higher than the maximum temperature at which any portion of the operational component might reach, avoiding the vaporization of any portion of the first cooling fluid by the component, or by vapor heated by the component. Alternatively, the first cooling fluid could be characterized by a boiling point such that at least some, though not all, of the first cooling fluid in contact with the operational component remains in a liquid state during normal cooling system operation. In this alternative the component experiences pool boiling in addition to mixed convection when some portions of the component get too hot.

Preferably, the first and second cooling fluids do not conduct electricity. Additionally, leads 121 from the component are preferably hermetically sealed by a sealant to avoid contact with the first cooling fluid. Similarly, exposed electrically conductive surfaces on the component may be sealed.

The cooling pool 119 cools the component 101, and heat absorbed from the component heats the cooling pool. A pump 123 drives cooling fluid through the cooling fluid exhaust passageway, and is thereby configured to pump the heated first cooling fluid from the cooling chamber 109, through a heat exchanger inlet formed by the cooling fluid exhaust passageway 111, and to the heat exchanger 113. The heat exchanger may operate by any of a number of different cooling schemes, including air cooling and liquid loop cooling, as is known for heat exchangers. The heat exchanger is configured to receive and cool the heated first cooling fluid from the cooling pool 119, which might be augmented by using a plurality of cooled fins 125 or passageways.

The heat exchanger and reservoir may be coextensive, as depicted, forming a liquid-supply chamber. Alternatively, they may be separate, and the reservoir may serve as a liquid-supply chamber. The cooled first cooling fluid within the liquid-supply chamber is pumped through the cooling fluid return passageway 117 by pressure within the reservoir due to the pump 123, and returned to the cooling pool 119.

By cooling the fluid received from the body of the first cooling fluid that forms the cooling pool, and returning it to the cooling pool, the heat exchanger is configured to cool the body of the first cooling fluid in which the component is thermally exposed. The first cooling subsystem thus defines a first-subsystem closed pathway in which the first cooling fluid circulates to cool the component by convection. The heat flux with which the first cooling subsystem operates depends on the heat radiated by the component. Thus, within the first cooling subsystem's range of heat dissipation, its heat flux is self adjusting.

The first cooling subsystem may be configured to operate continuously (without being controlled by the controller), or may include a control mechanism configured to control operation of the first cooling subsystem. If the first cooling subsystem is configured to operate under the control of the controller, then preferably the controller is configured to selectively operate the first cooling subsystem based on the cooling requirements of the component, and optionally on information regarding the operating level and/or functionality of the second cooling subsystem. To control the first cooling subsystem, preferably the controller controls the speed of the pump 123, and also preferably controls the heat flux of the heat exchanger 113, such as by controlling the operation of a fan convectively cooling the heat exchanger.

The second cooling subsystem is separately operable from the first cooling subsystem, and the controller is configured to selectively operate the second cooling subsystem based on the cooling requirements of the component. More particularly, the controller forms a control system configured to receive heat-generation information (e.g., from temperature sensors or from processor level monitors) for certain high heat-flux regions of the component that are to have cooling fluid impinge thereon, and configured to control the spraying of the sprayer in response to the heat-generation information.

The second cooling subsystem defines a second-subsystem closed pathway in which the second cooling fluid circulates to spray cool the component. The first-subsystem pathway and the second-subsystem pathway are at least partially distinct.

The second cooling subsystem is configured to spray cool (i.e., cool by phase change with) one or more impingement regions (i.e., the high heat-flux regions) of the component 101 at a heat flux that typically will be substantially greater than the heat flux with which the first cooling subsystem is capable of cooling the component. The second cooling subsystem spray-cools the impingement regions of the component with the second cooling fluid to achieve this greater level of heat flux. The controller is preferably configured to control the volumetric flux of coolant sprayed by the spray cooling system in response to the cooling needs of the component. Thus, within the second cooling subsystem's range of heat dissipation, its heat flux is adjusted by the controller.

The spray cooling system may be any of a variety of systems, such as incremental spray systems (e.g., a thermal spray jet or piezoelectric sprayer), electrostatically-driven sprays, or continuous spray systems. The spray cooling system includes a sprayer 131, and a sprayer inlet forming a spray-cooling return passageway 133. The sprayer is selected to have sufficient pressure for overcoming the resistance of the first cooling fluid.

The sprayer 131 is configured to spray the second cooling fluid in a liquid state, in one or more streams, through the cooling pool 119 and into thermal contact with the one or more impingement regions of the thermally exposed component. Depending upon several variables, including the surface tension of the first cooling fluid and the inertia of the second cooling fluid, each stream might or might not maintain its continuity until it impinges upon the component.

The viscosity of the first cooling fluid damps the axisymmetric oscillations at the interface between first and second fluids, thus delaying the breakup of the jet into droplets. A delayed breakup is desirable, but a an unbroken jet can lead to delivery of too much of the second cooling fluid in the impingement region, thereby reducing the heat transfer coefficient. Therefore, an appropriate viscosity providing for damping, but allowing for eventual breakup of the jet, is desirable. Since the viscosity is a strong function of temperature, this analysis can be programmed into the control system. Of course, experimental data can be used to support or determine control system parameters. As a result of the above, the first cooling fluid improves the utilization of the sprayed cooling fluid by preventing splashing and absorbing generated vapor around the impingement region.

The sprayed second cooling fluid impinges on the one or more impingement regions of the component, and vaporizes due to heat absorbed from the impingement regions. Due to the buoyancy, temperature, expansion, momentum, and/or currents and turbulence, the vapor moves away from the component and is exposed to the first cooling fluid. The first cooling fluid absorbs heat from the second cooling fluid, causing it to cool and condense. Because the two cooling fluids in their liquid state are immiscible, the cooling fluids separate such that the less-dense liquid floats on top of the more-dense liquid.

The skin friction drag of the one or more streams of second cooling fluid flowing through the first cooling fluid creates a mixed convection flow within the cooling chamber, and assists in convectively cooling the portions of the component that are not in the one or more impingement regions of the thermally exposed component. More particularly, the spray of the second cooling fluid will cause forced convection regions near the impingement regions, and the spread the heat around and reduce thermal shock. The creation of vapor adds turbulence around the component, which further assists in cooling the convectively cooled portions of the component.

The sprayer inlet is configured to draw the second cooling fluid from a portion of the cooling chamber in which the second cooling fluid resides when separated from the first cooling fluid (e.g., from the gravitational top of the cooling chamber if the second cooling fluid floats on top of the first cooling fluid, as depicted, or from the gravitational bottom if the second cooling fluid sinks below the first cooling fluid). Likewise, the heat exchanger inlet is configured to draw the first cooling fluid from a portion of the cooling chamber in which the first cooling fluid resides when separated from the second cooling fluid (e.g., from the gravitational bottom of the cooling chamber if the second cooling fluid floats on the first cooling fluid, as depicted, or from the gravitational top if the second cooling fluid sinks below the first cooling fluid).

Communication between the control mechanisms of the first and/or second cooling subsystems (i.e., the pump 123 and the spray cooling system) and the controller may pass between the substrate 107 and the cooling cap 105, or through an external connection 135.

Figure 2:
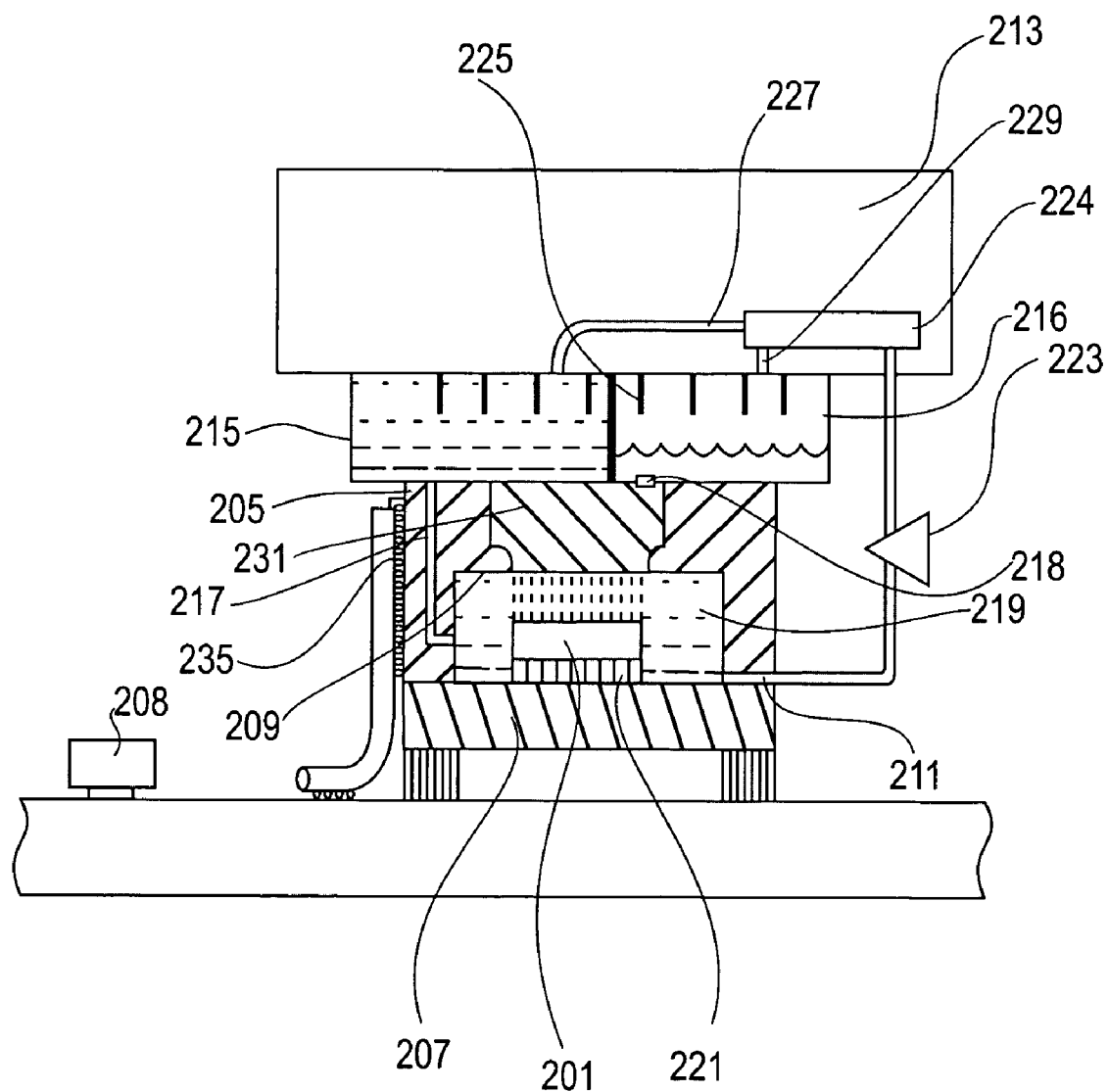
FIG. 2 is a cross-sectional view of a second cooling system embodying the invention.

With reference to FIG. 2, a second embodiment of a cooling system is also for cooling a component 201, such as a heat-generating semiconductor device, other information processing device, optical component, or the like. Structurally and operationally, this device is similar to the first embodiment, except as otherwise indicated below.

The cooling system cools the component with two cooling fluids of different compositions, a first cooling fluid, and a second cooling fluid. Unlike in the first embodiment, the two cooling fluids are miscible. When mixed, the two fluids form a solution. Exemplary first and second cooling fluids include glycerine and water, respectively.

The cooling system is incorporated into a housing forming a cooling cap 205, which is affixed to a substrate 207 mounting the component 201. The cooling cap may be removably affixed to the substrate, providing for both the cooling cap to be a modular part, and the component to be serviceable. The cooling system forms a closed loop system in the cooling cap when the cooling cap is affixed to the substrate. The cooling system includes a first cooling loop configured to convectively cool the component, a second cooling loop configured to spray cool the component, and a controller 208. Because the two cooling loops operate simultaneously, but at different rates of heat flux, different regions of the component are cooled at different rates depending on their cooling needs, providing for a reduction in overall temperature gradients across the component. The controller may be in a separate piece of hardware (as depicted), or incorporated within the component. The controller may be mechanical, electrical, software, or in another such control system form.

The first cooling subsystem preferably operates as a convective liquid loop cooling system. To this end, the cooling cap forms a cavity defining a cooling chamber 209, when affixed to the substrate 207, a cooling fluid exhaust passageway 211, a heat exchanger 213, a first reservoir 215, a second reservoir 216, a first cooling fluid return passageway 217, and a second cooling fluid return passageway 218.

The component 201 is thermally exposed in, and preferably contained within, the cooling chamber 209, into which the first cooling fluid pours from the first cooling fluid return passageway 217.

A body of the first cooling fluid within the cooling chamber 209 forms a cooling pool 219 around the component 201, and preferably completely wets the component. The cooling pool cools all thermally exposed portions of the component to which it is exposed via natural convection. This convection process is aided by the first cooling fluid's flow through the cooling chamber, and by fluid movement caused by interaction with the spray of the second cooling fluid, as is discussed below. In short, the cooling pool, while flowing through the cooling chamber, absorbs component heat and convectively removes the heat from the component.

Preferably, the first cooling fluid is characterized by a boiling point higher than a maximum temperature at which the cooling system is configured to have the first cooling fluid reach during normal cooling system operation. More particularly, the first cooling fluid is characterized by a boiling point higher than the maximum temperature at which any portion of the operational component might reach, avoiding the vaporization of any portion of the first cooling fluid by the component, or by vapor heated by the component. Alternatively, the first cooling fluid could be characterized by a boiling point such that at least some of the first cooling fluid in contact with the operational component remains in a liquid state during normal cooling system operation. In this alternative the component experiences pool boiling in addition to mixed convection when some portions of the component's get too hot.

Preferably, the first and second cooling fluids do not conduct electricity, even in solution. Additionally, leads 221 from the component are preferably hermetically sealed by a sealant to avoid contact with the first cooling fluid. Similarly, exposed electrically conductive surfaces on the component may be sealed.

The cooling pool 219 cools the component 201, and heat absorbed from the component heats the cooling pool. During operation, the first cooling fluid becomes mixed with the second cooling fluid in the cooling pool, and thus the cooling pool becomes a solution of the first cooling fluid and the second cooling fluid. The solution varies in concentration levels across the cooling pool. The overall proportion of the first cooling fluid in the solution will depend upon the rate at which the second cooling fluid is entering the cooling chamber, and on the rate with which solution is leaving the cooling chamber.

A pump 223 draws the solution through the cooling fluid exhaust passageway 211, and is thereby configured to pump the solution from the cooling chamber 209, through a heat exchanger inlet formed by the cooling fluid exhaust passageway 211, and to the heat exchanger 213. If the second cooling fluid is not entering the cooling chamber at a given time, then the proportion of the first cooling fluid in the "solution" could theoretically become virtually 100%. Nevertheless, the cooling fluid pumped from the cooling chamber through the cooling fluid exhaust passageway will be referred to as "the solution" for the purposes of this application.

The solution pumped from the cooling pool 219 is received in a separator 224. The separator raises the temperature of the solution such that the second cooling fluid within the solution is boiled off in a vapor, and thus is separated from the first cooling fluid. The remaining first cooling fluid, which has been substantially separated, and therefore substantially purified, passes through a first purified-fluid passageway 227 to the first reservoir 215. The separated second cooling fluid vapor, which has been substantially purified, passes through a second purified-fluid passageway 229 to the second reservoir 216.

The heat exchanger may operate by any of a number of different cooling schemes, including air cooling and liquid loop cooling, as is known for heat exchangers. The heat exchanger is configured to cool the heated first cooling fluid in the first reservoir 215, and to condense the vaporized second cooling fluid in the second reservoir 216, such as by using a plurality of fins 225.

Portions of the heat exchanger may be coextensive with the first reservoir, and with the second reservoir, as depicted, forming liquid-supply chambers for the first and second cooling fluids, respectively. Alternatively, the heat exchanger may be separate from the first and second reservoirs, and the first and second reservoirs may serve as liquid-supply chambers for the first and second cooling fluids, respectively. The cooled first cooling fluid within the first liquid-supply chamber is pumped through the first cooling fluid return passageway 217 by pressure within the reservoir due to the pump 223, and returned to the cooling pool 219.

By cooling the separated first cooling fluid in the solution received from the cooling pool, and returning it to the cooling pool, the heat exchanger is configured to cool the body of the first cooling fluid in which the component is thermally exposed. The first cooling subsystem thus defines a first-subsystem, closed pathway in which the first cooling fluid circulates to cool the component by convection. The heat flux with which the first cooling subsystem operates depends on the heat radiated by the component. Thus, within the first cooling subsystem's range of heat dissipation, its heat flux is self adjusting.

The first cooling subsystem may be configured to operate continuously (without being controlled by the controller), or may include a control mechanism configured to control operation of the first cooling subsystem. If the first cooling subsystem is configured to operate under the control of the controller, then preferably the controller is configured to selectively operate the first cooling subsystem based on the cooling requirements of the component, and optionally on information regarding the operating level and/or functionality of the second cooling subsystem. To control the first cooling subsystem, preferably the controller controls the speed of the pump 223 and/or the separator 224. Optionally, the controller may control the heat flux of the heat exchanger 213, such as by controlling the operation of a fan convectively cooling the heat exchanger.

The second cooling subsystem is separately operable from the first cooling subsystem, and the controller is configured to selectively operate the second cooling subsystem based on the cooling requirements of the component. More particularly, the controller forms a control system configured to receive heat-generation information (e.g., from temperature sensors or from processing level monitors) for certain high heat flux regions of the component that are to have cooling fluid impinge thereon, and configured to control the spraying of the sprayer in response to the heat-generation information.

The second cooling subsystem defines a second-subsystem closed pathway in which the second cooling fluid circulates to spray cool the component. The first-subsystem pathway and the second-subsystem pathway are at least partially distinct.

The second cooling subsystem is configured to spray cool (i.e., cool by phase change with) one or more impingement regions (i.e., the high heat-flux regions) of the component 201 at a heat flux that typically will be substantially greater than the heat flux with which the first cooling subsystem is capable of cooling the component. The second cooling subsystem spray-cools the component with the second cooling fluid to achieve this greater level of heat flux. The controller is preferably configured to control the flux of coolant sprayed by the spray cooling system in response to the cooling needs of the component. Thus, within the second cooling subsystem's range of heat dissipation, its heat flux is adjusted by the controller.

The spray cooling system may be any of a variety of systems, such as incremental spray systems (e.g., a thermal spray jet or piezoelectric sprayer), or continuous spray systems. The spray cooling system includes a sprayer 231 selected to have sufficient pressure for overcoming the resistance of the first cooling fluid, such that a substantial portion of sprayed second cooling fluid impinges on the component in a substantially pure form (i.e., not substantially mixed with the first cooling fluid).

The sprayer inlet is configured to draw the second cooling fluid from the second reservoir 216 through the second cooling fluid return passageway 218. The sprayer 231 is configured to spray the second cooling fluid in a liquid state, in one or more streams, through the cooling pool 219 and into thermal contact with the one or more impingement regions of the thermally exposed component. Depending upon several variables, including the surface tension of the first cooling fluid and the inertia of the second cooling fluid, each stream might or might not maintain its continuity until it impinges upon the component. Preferably, the first cooling fluid in its liquid state is characterized by a viscosity high enough, with respect to the viscosity of the second cooling fluid, to maintain the continuity of the streams of the sprayed cooling fluid until impingement. The presence of the first cooling fluid around the region of impingement preferably reduces splashing, and the related detrimental performance effects.

The sprayed second cooling fluid impinges on the one or more impingement regions of the component, and vaporizes due to heat absorbed from the impingement regions. Due to the buoyancy, temperature, expansion, momentum, and/or currents and turbulence, the vapor moves away from the component and is exposed to the solution in the cooling pool. The solution absorbs heat from the vaporized second cooling fluid, cooling it and causing it to condense. Because the two cooling fluids in their liquid state are miscible, the condensed second cooling fluid mixes into the solution, increasing the solutions percentage of second cooling fluid.

The skin friction drag of the one or more streams of second cooling fluid flowing through the solution creates a mixed convection flow within the cooling chamber, and assists in convectively cooling the portions of the component that are not in the one or more impingement regions of the thermally exposed component. More particularly, the spray of the second cooling fluid will cause forced convection regions near the impingement regions, and the spread the heat around and reduce thermal shock. The creation of vapor adds turbulence around the component, which further assists in cooling the convectively cooled portions of the component.

Communication between the control mechanisms of the first and/or second cooling subsystems (i.e., the pump 223, the separator 224, and the spray cooling system) and the controller may pass between the substrate 207 and the cooling cap 205, or through an external connection 235.

Figure 3:
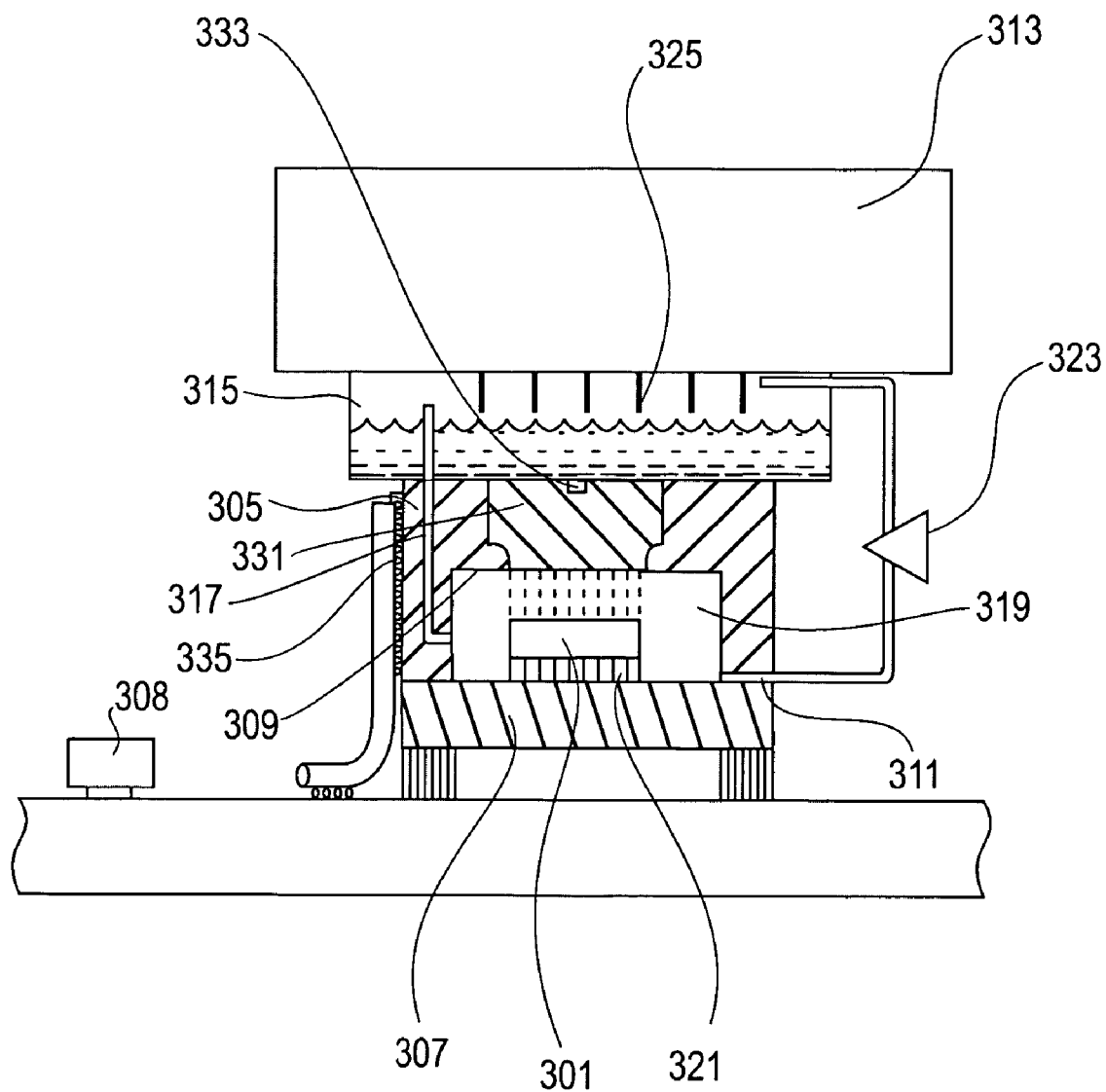
FIG. 3 is a cross-sectional view of a third cooling system embodying the invention.

With reference to FIG. 3, a third embodiment of a cooling system is for cooling a component 301, such as a heat-generating semiconductor device, other information processing device, optical component, or the like. Structurally and operationally, this device is similar to the first two embodiments, except as otherwise indicated below. As in the first to embodiments, the cooling system cools the component with two cooling fluids of different compositions, a first cooling fluid, and a second cooling fluid. However, in this embodiment the first cooling fluid is in a gaseous state. Preferably, the cooling chamber is not partially or totally evacuated. Instead, preferably the first cooling fluid contained in the cooling chamber is a gas having a higher thermal diffusivity than air in like conditions (i.e., at the same pressure, temperature, and the like). More preferably, the thermal diffusivity is substantially higher than that of air, and may be 10 times or more greater than the thermal diffusivity of air in like conditions. In various alternative embodiments, the first cooling fluid may have a Prandtl number different than that of air. Exemplary first and second cooling fluids include helium and water, respectively, or hydrogen and water, respectively. Helium, for example, has a thermal conductivity six times that of air (the thermal conductivity being directly related to thermal diffusivity).

The cooling system is incorporated into a housing forming a cooling cap 305, which is affixed to a substrate 307 mounting the component 301. The cooling cap may be removably affixed to the substrate, providing for both the cooling cap to be a modular part, and the component to be serviceable. The cooling system forms a closed loop system in the cooling cap when the cooling cap is affixed to the substrate. The cooling system includes a first cooling loop configured to convectively cool the component, a second cooling loop configured to spray cool the component, and a controller 308. Because the two cooling loops operate simultaneously, but at different rates of heat flux, different regions of the component are cooled at different rates depending on their cooling needs, providing for a reduction in overall temperature gradients across the component. The controller may be in a separate piece of hardware (as depicted), or incorporated within the component. The controller may be mechanical, electrical, software, or in another such control system form.

The cooling cap forms a cavity defining a cooling chamber 309, when affixed to the substrate 307, a cooling fluid exhaust passageway 311, a heat exchanger 313, a reservoir 315 and a cooling fluid return passageway 317. The component 301 is thermally exposed in, and preferably contained within, the cooling chamber 309, into which the first cooling fluid pours from the cooling fluid return passageway 317.

A body of the first cooling fluid within the cooling chamber 309, in a gaseous state, forms a gaseous cooling pool 319 around the component 301. The first cooling fluid cools all thermally exposed portions of the component to which it is exposed via natural convection. This convection process is aided by the first cooling fluid's flow through the cooling chamber, and by fluid movement caused by interaction with the spray of the second cooling fluid, as is discussed below. In short, the first cooling fluid, while flowing through the cooling chamber, absorbs component heat and convectively removes the heat from the component.

Preferably, the first cooling fluid is characterized by a boiling point lower than a minimum temperature at which the cooling system is configured to have the first cooling fluid reach during normal cooling system operation.

The gaseous cooling pool 319 cools the component 301, and heat absorbed from the component heats the cooling pool. A pump 323 drives cooling fluid through the cooling fluid exhaust passageway, and is thereby configured to pump the heated first cooling fluid from the cooling chamber 309, through a heat exchanger inlet formed by the cooling fluid exhaust passageway 311, and to the heat exchanger 313. In this embodiment, the pump should be configured for pumping a gas. The heat exchanger may operate by any of a number of different cooling schemes, including air cooling and liquid loop cooling, as is known for heat exchangers. The heat exchanger is configured to cool the heated first cooling fluid received from the gaseous cooling pool 319, such as by using a plurality of cooled fins 325 or passageways.

The heat exchanger and reservoir may be coextensive, as depicted, forming a liquid-supply chamber. Alternatively, they may be separate, and the reservoir may serve as a liquid-supply chamber. The cooled first cooling fluid within the liquid-supply chamber is pumped through the cooling fluid return passageway 317 by pressure within the reservoir due to the pump 323, and returned to the gaseous cooling pool 319. The cooling fluid return passageway opens at a high enough level in the liquid supply chamber to prevent any first cooling fluid from entering.

By cooling the fluid received from the body of the first cooling fluid that forms the gaseous cooling pool, and returning it to the cooling pool, the heat exchanger is configured to cool the body of the first cooling fluid in which the component is thermally exposed. The first cooling subsystem thus defines a first-subsystem closed pathway in which the first cooling fluid circulates to cool the component by convection. The heat flux with which the first cooling subsystem operates depends on the heat radiated by the component. Thus, within the first cooling subsystem's range of heat dissipation, its heat flux is self adjusting.

The first cooling subsystem may be configured to operate continuously (without being controlled by the controller), or may include a control mechanism configured to control operation of the first cooling subsystem. If the first cooling subsystem is configured to operate under the control of the controller, then preferably the controller is configured to selectively operate the first cooling subsystem based on the cooling requirements of the component, and optionally on information regarding the operating level and/or functionality of the second cooling subsystem. To control the first cooling subsystem, preferably the controller controls the speed of the pump 323. Optionally, the controller may control the heat flux of the heat exchanger 313, such as by controlling the operation of a fan convectively cooling the heat exchanger.

The second cooling subsystem is separately operable from the first cooling subsystem, and the controller is configured to selectively operate the second cooling subsystem based on the cooling requirements of the component. More particularly, the controller forms a control system configured to receive heat-generation information (e.g., from temperature sensors or from processing level monitors) for certain high heat flux regions of the component that are to have cooling fluid impinge thereon, and configured to control the spraying of the sprayer in response to the heat-generation information.

The second cooling subsystem defines a second-subsystem closed pathway in which the second cooling fluid circulates to spray cool the component. The first-subsystem pathway and the second-subsystem pathway are at least partially distinct.

The second cooling subsystem is configured to spray cool (i.e., cool by phase change with) one or more impingement regions (i.e., the high heat-flux regions) of the component 301 at a heat flux that typically will be substantially greater than the heat flux with which the first cooling subsystem is capable of cooling the component. The second cooling subsystem spray-cools the component with the second cooling fluid to achieve this greater level of heat flux. The controller is preferably configured to control the flux of coolant sprayed by the spray cooling system in response to the cooling needs of the component. Thus, within the second cooling subsystem's range of heat dissipation, its heat flux is adjusted by the controller.

The spray cooling system may be any of a variety of systems, such as incremental spray systems (e.g., a thermal spray jet or piezoelectric sprayer), or continuous spray systems. This embodiment is particularly amenable to use with low head incremental sprayers, such as those using thermal spray jet technology. The spray cooling system includes a sprayer 331, and a sprayer inlet forming a spray-cooling return passageway 333. The sprayer inlet is configured to draw condensed second cooling fluid from a lower portion of the reservoir.

The sprayer 331 is configured to spray the second cooling fluid in a liquid state, in one or more streams, through the gaseous cooling pool 319 and into thermal contact with the one or more impingement regions of the thermally exposed component.

Leads 321 from the component are preferably hermetically sealed by a sealant to avoid contact with the second cooling fluid. Similarly, exposed electrically conductive surfaces on the component may be sealed.

The sprayed second cooling fluid impinges on the one or more impingement regions of the component, and vaporizes due to heat absorbed from the impingement regions. Due to the buoyancy, temperature, expansion, momentum, and/or currents and turbulence, the vapor moves away from the component and is exposed to the first cooling fluid. The first cooling fluid absorbs heat from the second cooling fluid, causing some of it to cool, condense and fall to the bottom of the cooling chamber 309. Vapor that does not condense mixes with the heated first cooling fluid.

The skin friction drag of the one or more streams of second cooling fluid flowing through the first cooling fluid creates a mixed convection flow within the cooling chamber, and assists in convectively cooling the portions of the component that are not in the one or more impingement regions of the thermally exposed component. More particularly, the vaporization of the second cooling fluid will cause forced convection regions near the impingement regions, and the spread the heat around and reduce thermal shock. The creation of vapor adds turbulence around the component, which further assists in cooling the convectively cooled portions of the component.

The heat exchanger inlet is configured to draw the first cooling fluid from a bottom portion of the cooling chamber. If a pool of condensed second cooling fluid is present in the bottom of the cooling chamber, the pump 323 is configured to pump that condensed second cooling fluid up to the heat exchanger, where it passes into the reservoir. If not, the pump pumps the mixed first and vaporized second cooling fluids to the heat exchanger. There, the mix is cooled, and the second cooling fluid condenses into the reservoir.

Communication between the control mechanisms of the first and/or second cooling subsystems (i.e., the pump 323 and the spray cooling system) and the controller may pass between the substrate 307 and the cooling cap 305, or through an external connection 335.

Figure 4:
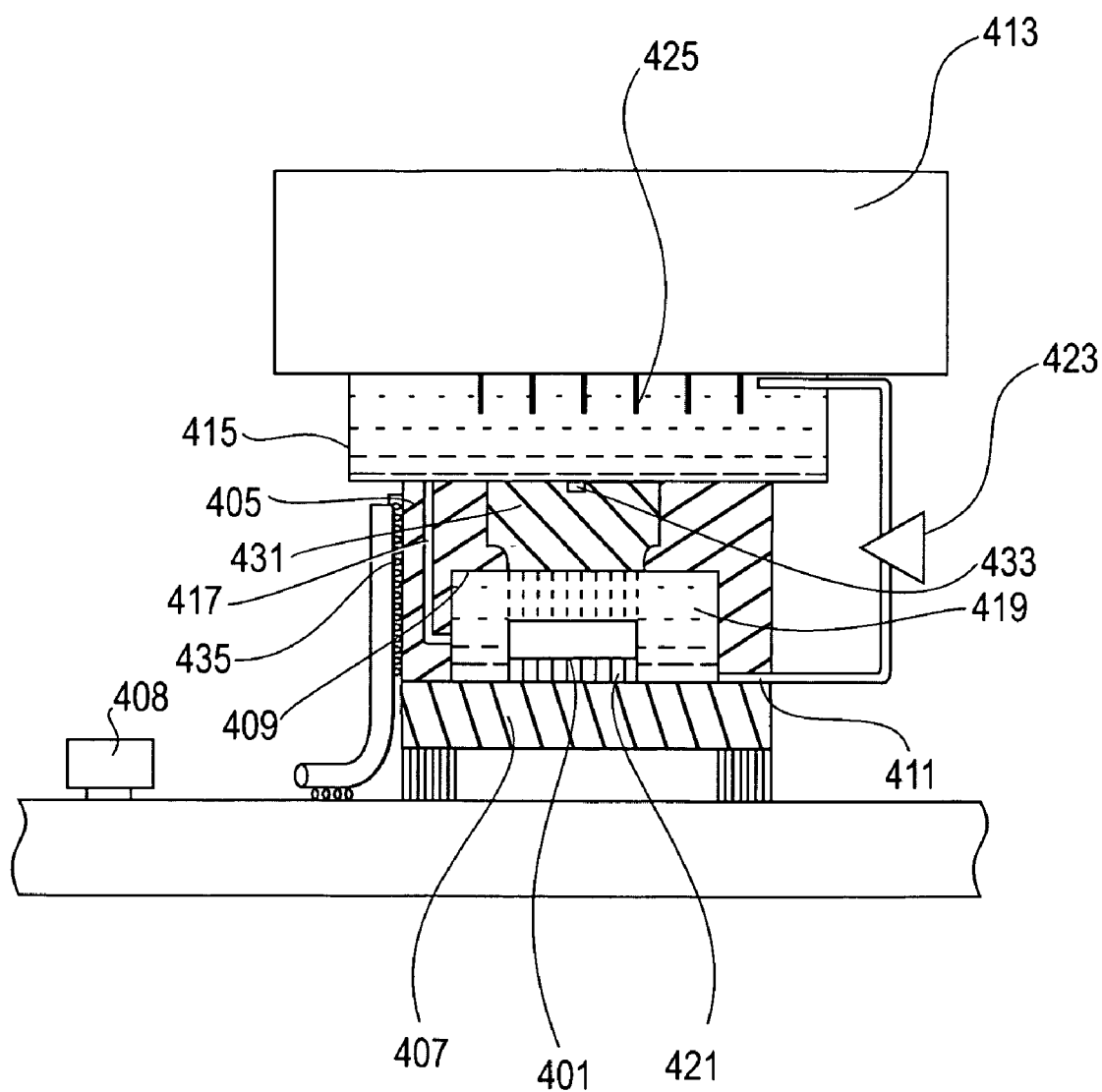
FIG. 4 is a cross-sectional view of a fourth cooling system embodying the invention.

With reference to FIG. 4, a fourth embodiment of a cooling system is for cooling a component 401, such as a heat-generating semiconductor device, other information processing device, optical component, or the like. Structurally and operationally, this device is similar to the first three embodiments, except as otherwise indicated below. The cooling system cools the component with a solution comprising two miscible cooling fluids of different compositions, a first cooling fluid, and a second cooling fluid. Exemplary first and second cooling fluids include glycerine and water, respectively.

The cooling system is incorporated into a housing forming a cooling cap 405, which is affixed to a substrate 407 mounting the component 401. The cooling cap may be removably affixed to the substrate, providing for both the cooling cap to be a modular part, and the component to be serviceable. The cooling system forms a closed loop system in the cooling cap when the cooling cap is affixed to the substrate. The cooling system includes a first cooling loop configured to convectively cool the component, a second cooling loop configured to spray cool the component, and a controller 408.

Because the two cooling loops operate simultaneously, but at different rates of heat flux, different regions of the component are cooled at different rates depending on their cooling needs, providing for a reduction in overall temperature gradients across the component. The controller may be in a separate piece of hardware (as depicted), or incorporated within the component. The controller may be mechanical, electrical, software, or in another such control system form.

The first cooling subsystem preferably operates as a convective liquid loop cooling system. To this end, the cooling cap forms a cavity defining a cooling chamber 409, when affixed to the substrate 407, a cooling fluid exhaust passageway 411, a heat exchanger 413, a reservoir 415 and a cooling fluid return passageway 417. The component 401 is thermally exposed in, and preferably contained within, the cooling chamber 409, into which the solution pours from the cooling fluid return passageway 417.

A body of the solution within the cooling chamber 409, received from the heat exchanger in a liquid state, forms a cooling pool 419 around the component 401, and preferably completely wets the component. The solution cools all thermally exposed portions of the component to which it is exposed via natural convection. This process is aided by the solution's flow through the cooling chamber, and by fluid movement caused by interaction with spray cooling, as is discussed below. In short, the solution, while flowing through the cooling chamber, absorbs component heat and convectively removes the heat from the component.

Preferably, the first cooling fluid is characterized by a boiling point higher than a maximum temperature at which the cooling system is configured to have the first cooling fluid reach during normal cooling system operation. More particularly, the first cooling fluid is characterized by a boiling point higher than the maximum temperature at which any portion of the operational component might reach, avoiding the vaporization of any portion of the first cooling fluid by the component, or by vapor heated by the component. Preferably, the portions of the component that are to be convectively cooled operate at a temperature lower than that required to boil the second cooling fluid out of the solution. Alternatively, the first and or second cooling fluids could have high enough specific heats to avoid a change of phase from the portions of the component being convectively cooled.

In another alternative, the first or second cooling fluids could be characterized by boiling points such that at least some, though not all, of the solution in contact with the convectively cooled portion of the operational component remains in a liquid state during normal cooling system operation. In this alternative the component experiences pool boiling in addition to mixed convection when some portions of the component get too hot.

Preferably, the first and second cooling fluids do not conduct electricity, even in solution. Additionally, leads 421 from the component are preferably hermetically sealed by a sealant to avoid contact with the solution. Similarly, exposed electrically conductive surfaces on the component may be sealed.

The cooling pool 419 cools the component 401, and heat absorbed from the component heats the cooling pool. A pump 423 drives the solution through the cooling fluid exhaust passageway, and is thereby configured to pump the heated first cooling fluid from the cooling chamber 409, through a heat exchanger inlet formed by the cooling fluid exhaust passageway 411, and to the heat exchanger 413. The heat exchanger may operate by any of a number of different cooling schemes, including air cooling and liquid loop cooling, as is known for heat exchangers. The heat exchanger is configured to receive and cool the solution including the heated first cooling fluid from the cooling pool 419, such as by using a plurality of cooled fins 425 or passageways.

The heat exchanger and reservoir may be coextensive, as depicted, forming a liquid-supply chamber. Alternatively, they may be separate, and the reservoir may serve as a liquid-supply chamber. The cooled solution within the liquid-supply chamber is pumped through the cooling fluid return passageway 417 by pressure within the reservoir due to the pump 423, and returned to the cooling pool 419.

By cooling the solution received from the cooling pool, and returning it to the cooling pool, the heat exchanger is configured to cool the body of the first cooling fluid in which the component is thermally exposed. The first cooling subsystem thus defines a first-subsystem closed pathway in which the first solution circulates to cool the component by convection. The heat flux with which the first cooling subsystem operates depends on the heat radiated by the component. Thus, within the first cooling subsystem's range of heat dissipation, its heat flux is self adjusting.

The first cooling subsystem may be configured to operate continuously (without being controlled by the controller), or may include a control mechanism configured to control operation of the first cooling subsystem. If the first cooling subsystem is configured to operate under the control of the controller, then preferably the controller is configured to selectively operate the first cooling subsystem based on the cooling requirements of the component, and optionally on information regarding the operating level and/or functionality of the second cooling subsystem. To control the first cooling subsystem, preferably the controller controls the speed of the pump 423. Optionally, the controller may control the heat flux of the heat exchanger 413, such as by controlling the operation of a fan convectively cooling the heat exchanger.

The second cooling subsystem is separately operable from the first cooling subsystem, and the controller is configured to selectively operate the second cooling subsystem based on the cooling requirements of the component. More particularly, the controller forms a control system configured to receive heat-generation information (e.g., from temperature sensors or from processing level monitors) for certain high heat-flux regions of the component that are to have cooling fluid impinge thereon, and configured to control the spraying of the sprayer in response to the heat-generation information.

The second cooling subsystem defines a second-subsystem closed pathway in which the solution circulates to spray cool the component. The first-subsystem pathway and the second-subsystem pathway are at least partially distinct.

The second cooling subsystem is configured to spray cool (i.e., cool by phase change with) one or more impingement regions (i.e., the high heat-flux regions) of the component 401 at a heat flux that typically will be substantially greater than the heat flux with which the first cooling subsystem is capable of cooling the component. The second cooling subsystem spray-cools the impingement regions of the component with the solution to achieve this greater level of heat flux. The controller is preferably configured to control the flux of coolant sprayed by the spray cooling system in response to the cooling needs of the component. Thus, within the second cooling subsystem's range of heat dissipation, its heat flux is adjusted by the controller.

The spray cooling system may be any of a variety of systems, such as incremental spray systems (e.g., a thermal spray jet or piezoelectric sprayer), or continuous spray systems. The spray cooling system includes a sprayer 431, and a sprayer inlet forming a spray-cooling return passageway 433. The sprayer is selected to have sufficient pressure for overcoming the resistance of the solution in the cooling pool. The sprayer inlet is configured to draw the cooled solution from the reservoir.

The sprayer 431 is configured to spray the solution in a liquid state, in one or more streams, through the cooling pool 419 and into thermal contact with the one or more impingement regions of the thermally exposed component. Depending upon several variables, each stream might or might not maintain its continuity until it impinges upon the component.

The sprayed solution impinges on the one or more impingement regions of the component, and the second cooling fluid in the sprayed solution vaporizes due to heat absorbed from the impingement regions. Due to the buoyancy, temperature, expansion, momentum, and/or currents and turbulence, the vapor moves away from the component and is exposed to the liquid solution of the cooling pool. The liquid solution absorbs heat from the vaporized second cooling fluid, causing it to cool and condense. The absorbed heat is defused in the cooling pool.

The skin friction drag of the one or more streams of sprayed solution flowing through the cooling pool creates a mixed convection flow within the cooling chamber, and assists in convectively cooling the portions of the component that are not in the one or more impingement regions of the thermally exposed component. More particularly, the spray of the sprayed solution will cause forced convection regions near the impingement regions, spread the heat around and reduce thermal shock. The creation of vapor adds turbulence around the component, which further assists in cooling the convectively cooled portions of the component.

Communication between the control mechanisms of the first and/or second cooling subsystems (i.e., the pump 423 and the spray cooling system) and the controller may pass between the substrate 407 and the cooling cap 405, or through an external connection 435.

While the invention has been described as incorporated in a cooling cap, it is to be understood that the heat exchanger and reservoirs may be separately located from the cooling cap. A spray cooling system of this sort is discussed in U.S. Pat. No. 6,550,263, issued Apr. 22, 2003, which is incorporated herein by reference for all purposes. Furthermore, a single heat exchanger and reservoir system may be configured to operate with a plurality of cooling chambers, each serving to cool one or more components. Additionally, embodiment variations that are not closed-loop systems (i.e., systems receiving the first and second cooling fluids from one or more sources, and exhausting the cooling fluids from the cooling chamber) are also within the scope of the invention.

It is to be understood that the invention comprises apparatus and methods for designing cooling systems and for producing cooling systems, and also the apparatus and methods of the cooling system itself. Additionally, the various embodiments of the invention can incorporate various combinations of the features disclosed above in generally discussing a spray cooling system, and can be designed, made and operated using related methods (or portions thereof) as described above for the spray cooling system. In short, the above disclosed features can be combined in a wide variety of configurations within the anticipated scope of the invention.

Furthermore, it is to be understood that cooled components, cooled singly or in groups as described above, can be mounted on circuit boards to form systems including one or more circuit boards carrying one or more cooled components that are electronically interlinked via the circuit boards. Such systems are also within the scope of the invention.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

What is claimed is:

1. A cooling system for cooling a component, comprising:
    a housing forming a cooling chamber in which the component is thermally exposed, the chamber containing a first cooling fluid;
    a sprayer configured to spray a second cooling fluid in a liquid state through the first cooling fluid in the chamber and into thermal contact with an impingement region of the thermally exposed component, the second cooling fluid being of a different composition than the first cooling fluid; and
    a heat exchanger configured to receive the first cooling fluid from the chamber, and to cool the received first cooling fluid.

2. The cooling system of claim 1, and further comprising a control system configured to receive heat-generation information for the impingement region of the component, and configured to control the spraying of the sprayer in response to the heat-generation information.

3. The cooling system of claim 1, wherein the first cooling fluid is characterized by a boiling point higher than a maximum temperature at which the cooling system is configured to have the first cooling fluid reach during normal cooling system operation.

4. The cooling system of claim 1, wherein the first cooling fluid is passed from the heat exchanger to the chamber in a liquid state.

5. The cooling system of claim 4, wherein the first cooling fluid in liquid state is characterized by a viscosity high enough, with respect to the viscosity of the second cooling fluid, to maintain the continuity of streams of the sprayed cooling fluid.

6. The cooling system of claim 4, and further comprising a pump configured to pump the first cooling fluid from the cooling chamber to the heat exchanger through a heat exchanger inlet.

7. The cooling system of claim 4, wherein:
    the first and second cooling fluids are immiscible;
    one of the first and second cooling fluids floats with respect to the other of the first and second cooling fluids;
    the cooling chamber is configured for the floating liquid to be drawn from the top of the chamber, and for the other liquid to be drawn from the bottom of the chamber; and
    the cooling chamber is configured for the second cooling fluid to be drawn from the cooling chamber into the sprayer.

8. The cooling system of claim 4, wherein the first and second cooling fluids are miscible, and further comprising a separator configured to separate a solution containing the first and second cooling fluids drawn from the cooling chamber.

9. The cooling system of claim 1, wherein the first cooling fluid is passed from the heat exchanger to the chamber in a gaseous state.

10. The cooling system of claim 9, wherein the first cooling fluid is a gas having a thermal diffusivity higher than that of air in a like state.

11. The cooling system of claim 9, wherein the first cooling fluid is a gas having a thermal diffusivity ten times higher than that of air in a like state.

12. The cooling system of claim 9, wherein the first cooling fluid is helium.

13. The cooling system of claim 9, and further comprising a sprayer inlet configured to draw the second cooling fluid from a reservoir in fluidic communication with the heat exchanger.

14. The cooling system of claim 9, and further comprising a heat exchanger inlet and pump configured to draw liquid and gaseous cooling fluid from the bottom of the cooling chamber.

15. The cooling system of claim 14, and further comprising:
    a first heat exchanger outlet configured to expel the first cooling fluid from an upper portion of the heat exchanger in which the first cooling fluid would reside when separated from liquid second cooling fluid; and
    a second heat exchanger outlet configured to expel the second cooling fluid from a lower portion of the heat exchanger in which liquid second cooling fluid would reside when separated from the first cooling fluid.

16. A method of cooling a component, comprising:
    placing the component in thermal contact with a first cooling fluid to cool the component;
    spraying a second cooling fluid in a liquid state through the first cooling fluid and into thermal contact with an impingement region of the component, wherein the second cooling fluid is of a different composition than the first cooling fluid; and
    cooling the first cooling fluid.

17. A cooling system for cooling a component, comprising:
   a means for spraying a second cooling fluid in a liquid state through a first cooling fluid and into thermal contact with an impingement region of the component, wherein the second cooling fluid is of a different composition than the first cooling fluid; and
   a means for cooling the first cooling fluid.

18. A cooling system for cooling a component, comprising:
   a housing forming a cooling chamber in which the component is thermally exposed to a first cooling fluid; and
   a sprayer configured to spray a second cooling fluid in a liquid state through the first cooling fluid in the chamber and into thermal contact with an impingement region of the thermally exposed component, the second cooling fluid being of a different composition than the first cooling fluid;
   wherein the housing defines an inlet for the cooling chamber to receive the first cooling fluid.

19. The cooling system of claim 18, wherein:
   the first and second cooling fluids are immiscible;
   one of the first and second cooling fluids floats with respect to the other of the first and second cooling fluids;
   the cooling chamber is configured for the floating liquid to be drawn from the top of the chamber, and for the other liquid to be drawn from the bottom of the chamber; and
   the cooling chamber is configured for the second cooling fluid to be drawn from the cooling chamber into the sprayer.

20. The cooling system of claim 18, wherein the first and second cooling fluids are miscible, and further comprising a separator configured to separate a solution containing the first and second cooling fluids drawn from the cooling chamber.

21. The cooling system of claim 18, and further comprising a heat exchanger, wherein the heat exchanger is configured to pass the first cooling fluid through the inlet and to the chamber in a gaseous state.

22. The method of claim 16, wherein the first cooling fluid is characterized by a boiling point higher than a maximum temperature at which the cooling system is configured to have the first cooling fluid reach during normal cooling system operation.

23. The method of claim 16, wherein the second cooling fluid is sprayed through a chamber to be in thermal contact with the component; wherein a heat exchanger is used in the step of cooling the first cooling fluid; and further comprising passing cooled first cooling fluid from the heat exchanger to the chamber in a liquid state.

24. The method of claim 23, and further comprising pumping the first cooling fluid from the cooling chamber to the heat exchanger through a heat exchanger inlet.

25. The method of claim 23, wherein the first and second cooling fluids are selected such that they are immiscible, and one of the first and second cooling fluids floats with respect to the other of the first and second cooling fluids, and further comprising:
   drawing the floating liquid from the top of the chamber; and
   drawing the other liquid from the bottom of the chamber;
   wherein the cooling chamber is configured for the second cooling fluid to be drawn from the cooling chamber into the sprayer.

26. The method of claim 23, wherein the first and second cooling fluids are miscible, and further comprising separating a solution containing the first and second cooling fluids drawn from the cooling chamber.

27. The method of claim 16, wherein the second cooling fluid is sprayed through a chamber to be in thermal contact with the component; wherein a heat exchanger is used in the step of cooling the first cooling fluid; and further comprising passing cooled first cooling fluid from the heat exchanger to the chamber in a gaseous state.

28. The method of claim 27, and further comprising:
   pumping cooling fluid from the bottom of the cooling chamber to an inlet of the heat exchanger;
   expelling the first cooling fluid to the chamber from an upper portion of the heat exchanger in which the first cooling fluid would reside when separated from liquid second cooling fluid; and
   expelling the second cooling fluid from a lower portion of the heat exchanger in which liquid second cooling fluid would reside when separated from the first cooling fluid.

* * * * *